United States Patent
Ogawa et al.

[11] Patent Number: 5,457,429
[45] Date of Patent: Oct. 10, 1995

[54] RING OSCILLATOR CIRCUIT FOR VCO

[75] Inventors: Akihide Ogawa; Kazuhiro Takeda, both of Nagasaki; Masami Goseki, Kanagawa, all of Japan

[73] Assignee: Sony Corporation, Tokyo, Japan

[21] Appl. No.: 290,621

[22] Filed: Aug. 15, 1994

[30] Foreign Application Priority Data

Aug. 24, 1993 [JP] Japan ................................. 5-230972

[51] Int. Cl.⁶ .............................. H03K 3/03; H03K 3/354
[52] U.S. Cl. .................... 331/57; 331/108 A; 331/177 R
[58] Field of Search .............................. 331/57, 108 A, 331/177 R

[56] References Cited

U.S. PATENT DOCUMENTS 5,038,118  8/1991  Langenkamp .............................. 331/57
5,081,428  1/1992  Atriss et al. .............................. 331/57

FOREIGN PATENT DOCUMENTS 0416145  3/1991  European Pat. Off. .
2-53304  2/1990  Japan .

Primary Examiner—Siegfried H. Grimm
Attorney, Agent, or Firm—Ronald P. Kananen

[57] ABSTRACT

In a ring oscillator type VCO in which plural stages of inverter circuits are cascade-connected to each other so as to constitute a positive feedback loop, delay amounts for both a rising edge and a falling edge of an output signal from the inverter circuit are controlled to have the same delay amount by way of a control signal. These delay amounts of the rising edge and the falling edge are controllable in such a manner that the duty ratio of an oscillator output signal is not varied. Each stage of the inverter circuit is arranged by three-stage inverters made of load transistors and driver transistors, and the control voltage is applied to the load transistors of the two adjoining inverters among the three-stage inverters.

9 Claims, 3 Drawing Sheets

Single-stage inverter circuit

Waveform chart

Inverter circuit

Vc : Control voltage

Waveform chart

Basic circuit arrangement of ring oscillator type VCO

RING OSCILLATOR CIRCUIT FOR VCO

BACKGROUND OF THE INVENTION

1. Field of the Invention

The present invention generally relates to a ring oscillator type voltage-controlled oscillator (VCO). More specifically, the present invention is directed to a ring oscillator type VCO capable of controlling a phase of an oscillated output signal based upon a control voltage without varying a duty ratio thereof.

2. Description of the Related Art

As a voltage-controlled oscillator (abbreviated as "VCO"), a ring oscillator type VCO as represented in FIG. 1A and FIG. 1B is known. In such a ring oscillator type VCO, odd numbered stages of inverter circuits are cascade-connected to each other, thereby constituting a positive feedback loop, and a control voltage Vc is applied to the inverter circuits at the respective stages. It should be noted that a capacitor indicates a load capacitance.

The Japanese Laid-open patent application No.2-53304 opened in 1990 discloses such a conventional ring oscillator type VCO constructed of a bipolar IC. To the contrary, another conventional ring oscillator type VCO constructed of a MOSIC is generally illustrated in FIG. 1B, and arranged such that each stage of the inverter circuit is constructed of a single inverter made of the load transistor $Q_L$ and the driver transistor $Q_D$, and then the control voltage Vc is applied to the load transistor $Q_L$.

FIG. 2 is a waveform chart for representing an input signal "Vin" and an output signal "Vout" of one inverter.

In the above-explained conventional ring oscillator type VCO, shown in FIGS. 1A and 1B, when the input signal Vin has fallen from a "high" level to a "low" level, the charging operation to the load capacitance of the next stage is commenced by the load transistor $Q_L$. In connection with this charging operation, the level of the output voltage Vout is increased with an inclination (namely, an increasing speed) corresponding to the control voltage Vc, and gradually reaches the voltage level of the power source. Then, this source voltage level of the output signal Vout is maintained for a moment. Thereafter, this input signal Vin is raised from the "low" level to the "high" level. Accordingly, the source voltage level (namely, the high level) of the output signal Vout is inverted to the low level. It should be understood that although a certain delay is actually produced between the rising (from LOW to HIGH) operation of this input signal Vin and the falling operation (from HIGH to LOW) of the output signal Vout, this delay amount is assumed to be zero for the sake of convenience. Then, while the level of the input signal Vin is high, the level of the output signal Vout is maintained at 0V. When the input signal Vin has fallen from the high level to the low level, the load capacitance is charged by the load transistor $Q_L$, so that the output signal Vout is increased at a certain increasing speed.

Then, the increasing (rising) speed of the output signal Vout from the level of 0V to the voltage level of the power source can be varied by controlling the control voltage Vc. As a consequence, the phase and the oscillating frequency can be changed by leading and delaying the timings, in response to the control voltage Vc, at which the output voltage Vout from the inverter circuit rises from 0V and intersects the threshold voltage of the inverter circuit of a subsequent stage.

On the other hand, in accordance with the conventional ring oscillator type VCO as shown in FIG. 1B, only the delay amount of the rising edge of the output signal waveform within a single stage of inverter circuit can be controlled based on the control voltage Vc, but the delay amount of the falling edge thereof cannot be controlled.

Then, in the conventional ring oscillator type VCO represented in FIG. 1B, a p-channel MOS transistor is controlled as the load transistor (a variable current source) by the control voltage Vc. Alternatively, an n-channel MOS transistor may be controlled as this load transistor based on the control voltage Vc. In this alternative example, the delay amount of the falling edge of the output signal waveform may be controlled. However, conversely, the delay amount of the rising edge cannot be controlled.

In any of the conventional inverter circuits, only a delay amount of either the rising edge, or the falling edge of the output signal waveform can be controlled.

As a consequence, the edge delay control for the output signal waveform can be done only for every second stage, so that the duty ratio of the oscillated output signal waveform would be varied by the control voltage Vc.

Thus, it is very inconvenient when such a conventional ring oscillator type VCO is utilized as a digital type phase comparator of a PLL circuit, since the delay amounts of both the rising edge and the falling edge of each stage of the inverter circuit would be directly reflected into the resolution of this phase comparator. As a result, no high-precision PLL control operation can be achieved. There is also another problem in that the conventional ring oscillator type VCO cannot be utilized in a usage which requires a secondary distortion (duty ratio) characteristic of the oscillator output.

Object and Summary of the Invention

The present invention has been made in an attempt to solve these problems, and therefore, has an object to provide a ring oscillator type VCO such that delay amounts of both a rising edge of an output signal derived from an inverter circuit and a falling edge of this output signal can be controlled to have similar amounts, and the delay amounts of these rising edge and falling edge can be controlled so as not to vary the duty ratio of an oscillator output signal.

This ring oscillator type VCO is characterized in that an inverter circuit is arranged by three-stage inverters made of load transistors and drive transistors, and a control voltage is applied to the load transistors of two adjoining inverters among the three-stage inverters.

Accordingly, in accordance with the ring oscillator type VCO of the present invention, since a single inverter circuit is arranged by the three-stage inverters and the load transistors of the two adjoining inverters among the three-stage inverters are controlled by the control voltage, the delay amounts of the three-stage inverters can be controlled as follows: The same delay amount can be achieved in such a manner that one of the rising edge of the output signal waveform and the falling edge thereof is controlled by way of one of these two adjoining inverters, and the other of the rising edge and the falling edge is controlled by way of the other of these two adjoining inverters. Therefore, the delay amounts of the rising edge as well as the falling edge of the output signal waveform can be controlled without producing any variations in the duty ratio.

BRIEF DESCRIPTION OF THE DRAWINGS

The above-described aspects and other features of the present invention will now be explained in the following description, taken in conjunction with the accompanying drawings in which.

DETAILED DESCRIPTION OF THE PREFERRED EMBODIMENTS

Figure 1A:
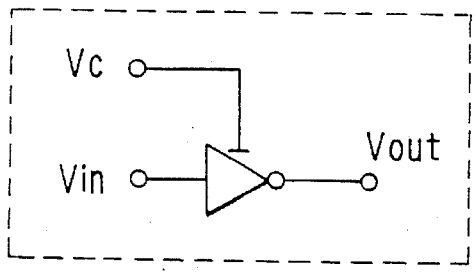
FIGS. 1A and 1B are circuit diagrams for showing the inverter block employed in the conventional ring oscillator.

A ring oscillator type voltage-controlled oscillator (VCO) according to the present invention will now be described in detail with reference to various embodiments shown in the drawings.

Figure 3:
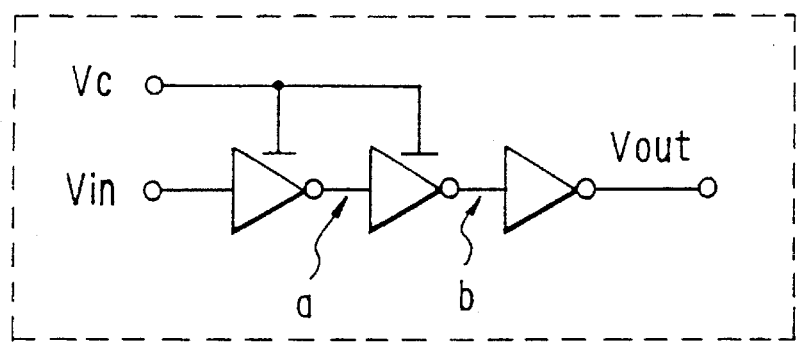
FIG. 3 is a schematic circuit diagram of an inverter block according to a first embodiment of the present invention.
Figure 4:
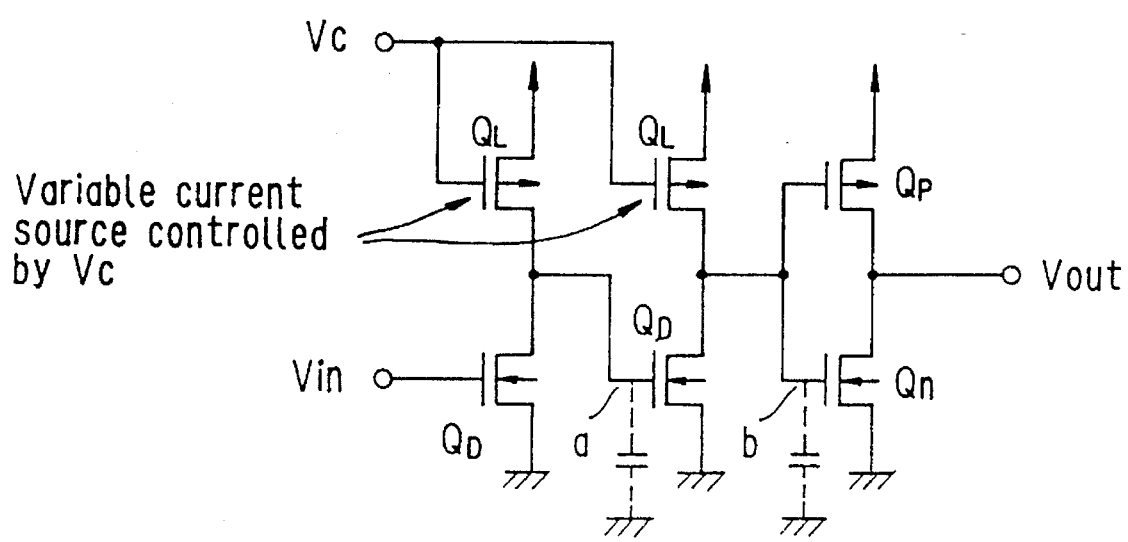
FIG. 4 shows a circuit arrangement of an inverter according to a second embodiment of the present invention.
Figure 5:
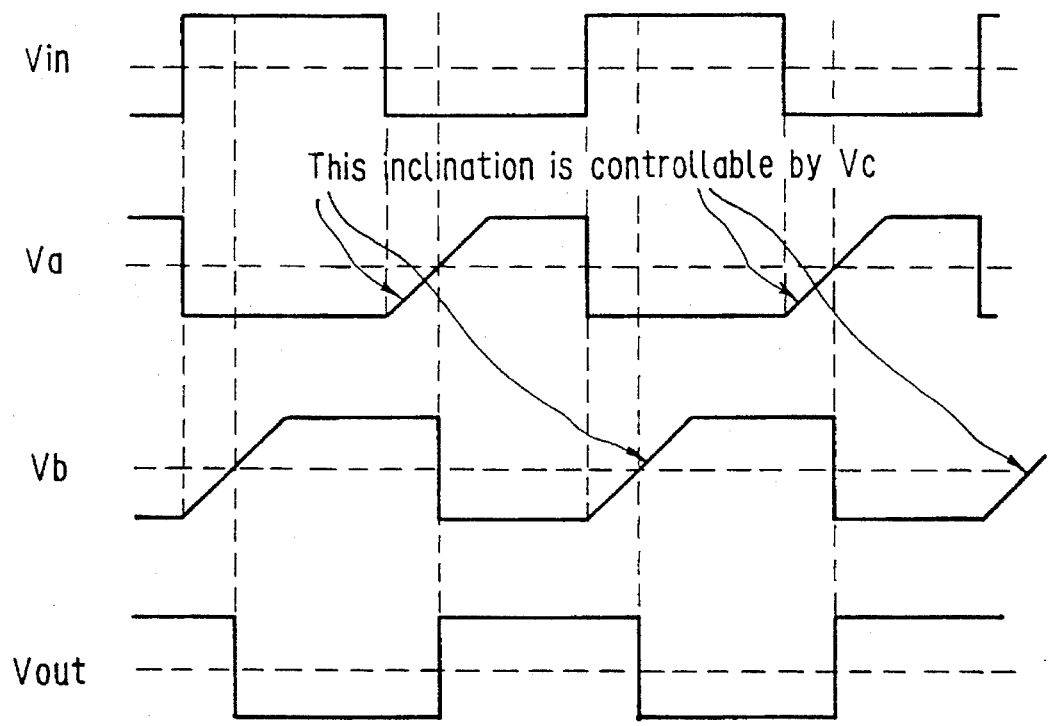
FIG. 5 is a waveform chart for explaining operations of the inverter circuit shown in FIG. 4.

FIGS. 3, 4 and 5 represent a single (one stage) inverter circuit and signal waveforms of this inverter of a ring oscillator type VCO, which constitutes first and second embodiments respectively shown in FIGS. 3 and 4. That is, FIG. 3 of these drawings represents a schematic circuit arrangement of this one-stage inverter circuit, whereas FIG. 4 indicates a specific circuit diagram of this inverter circuit. FIG. 5 shows a waveform chart of this inverter circuit.

Figure 1B:
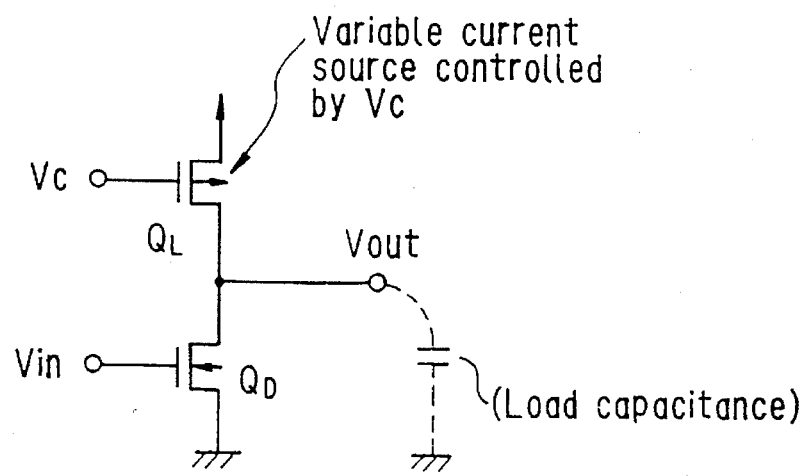
Figure 2:
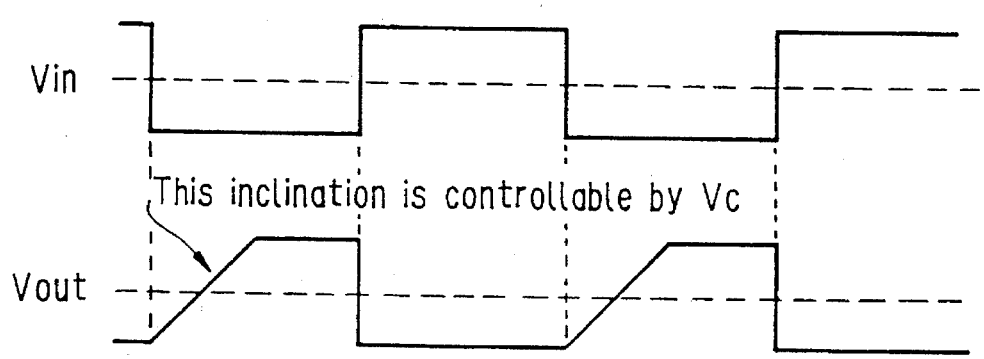
FIG. 2 is a waveform chart for representing operations of the ring oscillator, shown in FIGS. 1A and 1B.

This ring oscillator type VCO is so constructed that plural stages of the inverter circuit are employed to constitute a positive feedback loop, and then control voltages "Vc" applied to the respective stages of the inverter circuit are controlled. As to this circuit arrangement, the basic arrangement thereof is common to that of the conventional inverter circuit shown in FIGS. 1A and 1B. However, the inverter circuit of the ring oscillator type VCO, according to the first embodiment, has a feature that, as shown in FIG. 3, the three stages of inverters are cascade-connected. This featured circuit arrangement of the first embodiment is completely different from the inverter circuit of the conventional ring oscillator type VCO.

Each of these inverters which constitute the inverter circuit is arranged by a series-connected circuit of a p-channel MOS transistor and an n-channel MOS transistor, which are connected between a power source voltage terminal and the ground. A capacitor shown in FIG. 4 indicates a load capacitance.

Then, the p-channel MOS transistors of the first-stage inverter and the second-stage inverter are commonly controlled as load transistors $Q_L$ and $Q_L$ by way of a control voltage Vc. The n-channel MOS transistors of the first-stage and second-stage inverters commonly function as driver transistors $Q_D$ and $Q_D$. Then, the third-stage inverter is arranged by the normal CMOS transistor in which no delay control is carried out.

In such an inverter circuit, the rising speed is changed when a signal "Va" at a node "a" is increased, or raised from 0V to Vcc levels, depending upon the magnitude of the current flowing through the load transistor of the first-stage inverter. The larger this current flows, the higher the rising speed becomes. As a consequence, the timing of the rising edge of the output signal Vout would become earlier.

Also, the rising speed is changed when a signal "Vb" of the node "a" is increased from 0V to Vcc levels, depending upon the magnitude of the current flowing through the load transistor $Q_L$ of the second-stage inverter. The larger this current flows, the higher the rising speed becomes. As a result, the timing of the rising edge of the output signal Vout would occur earlier.

Accordingly, in accordance with the first embodiment, both of the rising edge of the output signal Vout and the falling edge thereof are delayed in a similar manner, so that the phase of this output signal Vout can be controlled. Then, since both of the rising edge of the output signal Vout and the falling edge thereof may be delayed by the same delay amount, the duty ratio of the output signal Vout can be continuously maintained at a constant value unrelated to variations in the control voltage Vc, for instance, 50%.

As a consequence, the inverter circuit of this first embodiment could be employed without any problem in such a case that the delay amounts of both the rising edge of the output signal Vout and the falling edge thereof may directly cause the resultant resolution of the phase comparator, as in the conventional inverter circuit. Furthermore, the secondary distortion (duty ratio) characteristic of the oscillator output can be utilized in the required usage.

It should be noted that although the p-channel MOS transistor of the first-stage inverter and the second-stage inverter employed within the inverter circuit of the above-explained first and second embodiments are used as the load transistors (i.e., variable current sources) and the n-channel MOS transistors are employed as the driver transistors, the concept of the present invention may be realized by employing such a circuit arrangement that the n-channel MOS transistors of the first-stage and second-stage inverters are employed as the load transistors (i.e., variable current sources), and the p-channel MOS transistors thereof are utilized as the driver transistors.

Furthermore, although the delay amounts of the rising edge and the falling edge are controlled by way of the first-stage and second-stage inverters within the inverter circuit in accordance with the above-explained first and second embodiments, the delay amounts of the rising edge and also the falling edge may be controlled by way of the second-stage and third-stage inverters.

As described above, the present invention may be embodied by way of various modes.

Figure 6:
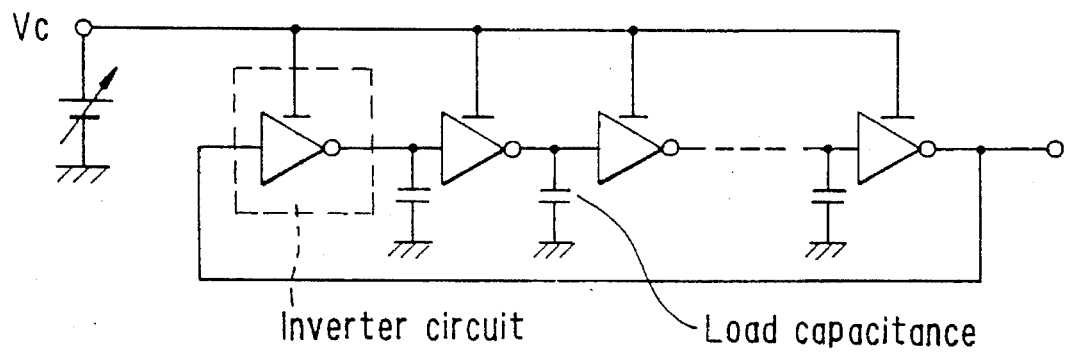
FIG. 6 is a schematic block diagram for showing a ring oscillator type VCO according to a third embodiment of the present invention.

FIG. 6 is a schematic circuit diagram of another ring oscillator type VCO according to a third embodiment of the present invention.

In this ring oscillator type VCO, the inverters equipped with the variable current sources controlled by the control voltage Vc (namely, controlled by the transistors $Q_L$) shown in FIG. 4 are utilized as a single inverter unit, such inverter units are cascade-connected to each other, and load capacitances are added to the respective connection terminals of the cascade-connected inverter units. Furthermore, a portion of the output signal derived from the final-stage inverter unit is positive-fed back to the input of the first-stage inverter unit. These final-stage inverter unit and first-stage inverter unit are cascade-connected to each other.

In this circuit arrangement of FIG. 6, the control voltages Vc are applied to the respective inverter units so as to vary the currents flowing through the inverters of the respective inverter units, and also to vary a time required to charge/discharge the capacitors, so that the delay times may be controlled. As a result, the frequency of the oscillator can be varied. In other words, this circuit may be operated as the VCO (voltage-controlled oscillator) circuit while using the ring oscillator.

The ring oscillator type VCO according to the present invention has such a feature that the inverter circuit is arranged by the three-stage inverters constructed of the load transistors and the driver transistors, and the control voltages are applied to the load transistors of the two adjoining inverters within the three-stage inverters.

As a consequence, in accordance with the ring oscillator type VCO of the present invention, since a single inverter circuit is arranged by the three-stage inverters, and also the load transistors of the two adjoining inverters within the three-stage inverters are controlled by the control voltages, the delay amounts of the three-stage inverters can be controlled as follows: The same delay amount can be achieved in such a manner that one of the rising edge of the output signal waveform and the falling edge thereof is controlled by way of one of these two adjoining inverters, and the other of the rising edge and the falling edge is controlled by way of the other of these two adjoining inverters. Therefore, the delay amounts of the rising edge as well as the falling edge of the output signal waveform can be controlled without producing any variations in the duty ratio.

What is claimed is:

1. A ring oscillator circuit comprising:

an even number of cascade-connected first inverters each having a first transistor and a second transistor series-connected to said first transistor, in which an input signal Vin is applied to an input terminal of one of said first and second transistors, a control signal Vc is supplied to an input terminal of the other of said first and second transistors, and outputs of said first and second transistors are commonly connected to each other; and a second inverter having a third transistor and a fourth transistor series-connected to said third transistor, in which input terminals of said third and fourth transistors to which an output signal from said first inverter is inputted are commonly connected to each other, and output terminals of said third and fourth transistors are commonly connected to each other.

2. A ring oscillator type VCO (voltage-controlled oscillator) wherein:

plural stages of inverter circuits are cascade-connected to each other, thereby constituting a positive feedback loop;

at least one inverter circuit among said plural stages of inverter circuits comprises three stages of inverters constructed of load transistors and driver transistors; and a control voltage is applied to the load transistors of two adjoining inverters among said three-stages of inverters.

3. A ring oscillator type VCO as claimed in claim 2 wherein:

each of said inverters includes a p-channel MOS transistor and an n-channel MOS transistor; and said p-channel MOS transistor is the load transistor having a gate to which the control voltage is applied.

4. A ring oscillator type VCO as claimed in claim 2, wherein:

each of said inverters includes a p-channel MOS transistor and an n-channel MOS transistor: and said n-channel MOS transistor is the load transistor having a gate to which the control voltage is applied.

5. A ring oscillator type VCO circuit comprising:

a voltage source;

a source of reference potential;

an even-numbered plurality of cascade-connected inverters comprising at least first and second stage inverters, each of said inverters including a series-connected circuit of a p-channel MOS transistor and an n-channel MOS transistor connected between said voltage source and said source of reference potential;

a control voltage for each of one of said p-channel MOS transistors and said n-channel MOS transistors in said first and said second stage inverters which commonly function as load transistors, so that the other of said p-channel MOS transistors and said n-channel MOS transistors in said first and said second stage inverters commonly function as driver transistors;

a voltage input provided to the driver transistor in said first inverter stage;

a third inverter stage connected to the output of said even-numbered plurality of said inverters;

a voltage output signal from said third inverter stage connected to said even-numbered plurality of said inverters, said voltage output signal having a rising edge and a falling edge delayed in a similar manner so that the duty ratio of the output signal can be continuously maintained at about a constant value.

6. A ring oscillator type VCO circuit as set forth in claim 5 wherein said even-numbered, cascade-connected plurality of inverter circuits include a positive feedback loop.

7. A ring oscillator type VCO circuit as set forth in claim 5 wherein the p-channel MOS transistors of the first and second stage inverters are employed as load transistors and the n-channel MOS transistors are employed as driver transistors.

8. A ring oscillator type VCO circuit as set forth in claim 7 wherein each of said load transistors includes a gate to which said control voltage is provided.

9. A ring oscillator type VCO circuit as set forth in claim 5 further including a load capacitance connected at an output of said even-numbered plurality of said cascade-connected inverters.

* * * * *